United States Patent [19]

Bartley et al.

[11] 4,400,762
[45] Aug. 23, 1983

[54] EDGE TERMINATION FOR AN ELECTRICAL CIRCUIT DEVICE

[75] Inventors: John E. Bartley, Greenfield, Wis.; Orville R. Penrod, Kernersville, N.C.

[73] Assignee: Allen-Bradley Company, Milwaukee, Wis.

[21] Appl. No.: 392,921

[22] Filed: Jun. 28, 1982

Related U.S. Application Data

[63] Continuation of Ser. No. 181,329, Aug. 25, 1980, abandoned.

[51] Int. Cl.³ ............................................. H05K 1/16
[52] U.S. Cl. .................... 361/402; 361/406; 338/329
[58] Field of Search ............... 338/312, 313, 329; 174/52 PE, 52 FP; 361/396, 400, 402–404, 406, 409, 410, 412

[56] References Cited

U.S. PATENT DOCUMENTS

| | | | |
|---|---|---|---|
| 3,346,774 | 10/1967 | Brady | 361/402 |
| 3,365,536 | 1/1968 | Martin | 361/402 |
| 3,492,536 | 1/1970 | Girolamo | 361/402 |
| 3,531,581 | 9/1970 | Chesemore | 361/402 |
| 3,638,162 | 1/1972 | McWade | 361/402 |
| 3,639,274 | 2/1972 | Brandt | 252/514 |
| 3,873,890 | 3/1975 | Beckman | 361/400 |
| 4,127,934 | 12/1978 | Bartley | 361/402 |
| 4,187,529 | 2/1980 | Bartley | 361/402 |
| 4,213,113 | 7/1980 | Brandt | 338/309 |

Primary Examiner—G. P. Tolin
Attorney, Agent, or Firm—Arnold J. Ericsen

[57] ABSTRACT

An electrical circuit device having a ceramic substrate including a thick or thin film circuit on at least one surface thereof and an intersecting edge surface which may support termination leads anchored thereto and further retained by solder deposited upon an edge termination coating. The termination coating underlying the solder extends over the edge defined by the intersecting surfaces. The component resides in form of the substrate to include an indented area in the form of a notch or a groove which intersects both adjoining surfaces to provide a means of receiving edge termination material, so as to insure a continuous and non-interrupted deposit of the material to complete the electrical circuit between the leads and the respective circuit components of the circuit defined on the said one substrate surface.

4 Claims, 6 Drawing Figures

EDGE TERMINATION FOR AN ELECTRICAL CIRCUIT DEVICE

This is a continuation of application Ser. No. 181,329, filed Aug. 25, 1980 now abandoned.

BACKGROUND OF THE INVENTION

The invention relates to electrical circuit devices, and particularly to a method and means for electrically connecting terminal leads, which extend outwardly from one surface of an insulating substrate, to electrical circuitry deposited on an adjoining surface of the substrate.

Over the past few years, there has been increased activity in providing electrical circuit components as printed or otherwise deposited configurations disposed on one or more surfaces of an insulating substrate member. The material of the substrate member is usually steatite, alumina or other ceramic based composition. Although the deposition of the materials required for supporting the electrical circuitry is usually quite sufficient with regard to the particular adjoining surfaces involved, very often it is difficult to insure that there will be an adequate thickness of the deposition of conducting edge termination material at the intersecting edge of the two adjacent surfaces. The conducting edge termination material is arranged to complete the circuit between termination leads extending outwardly from one edge and the adjacent intersecting surface which is intended to support the thick or thin film circuitry deposited thereon. The edge termination material underlies the deposited circuit layer(s) and under a solder layer on an adjoining surface in supporting contact with terminal leads projecting outwardly from that surface. The circuitry may be relatively simple, as for instance, a resistor network, capacitor electrodes or may include relatively complex semiconductor portions in the form of attached chips or other devices which comprise a hybrid assembly.

Devices, such as those to be hereinafter described, are made in relatively large quantities and are preferably arranged for automated manufacture. That is, the leads are very often attached by using conventional lead frame preforms, or other support carriers for a multiplicity of leads, and are further anchored to the substrate by means of solder applied with well-known solder flow bath or similar facilities. Thus, the leads may be initially held in place by wedging into a substrate opening and transported through a solder flow bath, where the solder will cling to the inner ends of the leads and to deposited solder-accepting edge termination areas applied to a surface of the substrate. The solder does not adhere to other portions of the substrate or the circuit. Techniques of this nature are disclosed in the electrical circuit devices illustrated and claimed in the Bartley et al U.S. Pat. Nos. 4,127,934; 4,187,529 and 4,213,113, and the Beckman et al U.S. Pat. No. 3,873,890, all patents being assigned to the same assignee as the present invention. The first mentioned patent relates to a single in-line packaging technique, (SIP), whereas the Beckman et al patent is directed to a dual in-line package (DIP).

Inasmuch as the edge termination composition is conventionally made from a material, such as silver, which tends to go into solution with a later-deposited solder layer, there is always present the possibility of leaching away of termination material which has been deposited on the adjoining surfaces during soldering operations. This deposition is usually applied by a transfer roller and often is thinnest at the relatively sharp edge defining the intersection of the two angularly relative surfaces. The Applicants are aware of some manufacturers who even go so far as to hand paint this sharp edge to insure a greater thickness of termination material. Obviously, this is a very expensive operation.

The applicants in researching this problem conceived of the present invention, which resides principally in providing an indentation extending between the adjoining surfaces and traversing the aforementioned relatively sharp line of intersection. This indentation may take the form of a simple notch at the line of intersection, or is preferably provided by means of a groove extending across the edge or surface which supports the terminal leads of conventional parallelepiped-formed dual in-line or single in-line packaged components. The groove finds its preference in the fact that molding dies used to press the ceramic substrate to form are easier to machine with a groove, as opposed to being machined to provide a plurality of relatively small protrusions arranged to form notched areas in the substrate. These projections used for notching are also relatively small and subject to early abrasive wear during use of the dies.

SUMMARY OF THE INVENTION

The present invention contemplates a method and means for improving and maintaining electrical conductivity in the edge termination layer deposited on one surface of a substrate and extending over an intersecting edge to an adjoining angularly disposed surface. The edge termination layer is of a conductive material intended to continue the circuit between electrical components supported by the substrate on the one surface and terminal leads extending outwardly from the adjoining surface. The material is compatible for electrical and mechanical connection with a solder layer deposited for retaining and anchoring the respective leads of the device. The substrate may be made of a ceramic material, such as alumina or steatite, and is pressed or otherwise formed to include an indented area, which is the subject of the present invention. The indented area may be in the form of a notch or an elongated groove intersecting both of the adjoining surfaces. The groove is preferably formed in the substrate simultaneously with the pressing operation. It will be apparent, that when necessary, and without departing from the invention, the groove or notch may be formed by abrasive, laser, or cutting operations after the substrate has been formed. The indented area provides a channel for insuring adequate deposition of the edge termination material as it traverses the adjoining surfaces. This is comparable to providing a conducting "wire" running from a respective lead attached to one surface, from the lead, across the edge termination surface supporting the lead, through the channel and onto the first-mentioned surface for electrical connection with circuitry supported by that surface.

Thus, any problems concerning leaching away of termination material during the soldering operations will be minimized by insuring adequate thickness of termination material as it extends from one surface across the relatively sharp edge or juncture between the adjoining surfaces.

DESCRIPTION OF THE PREFERRED EMBODIMENTS

Figure 1:
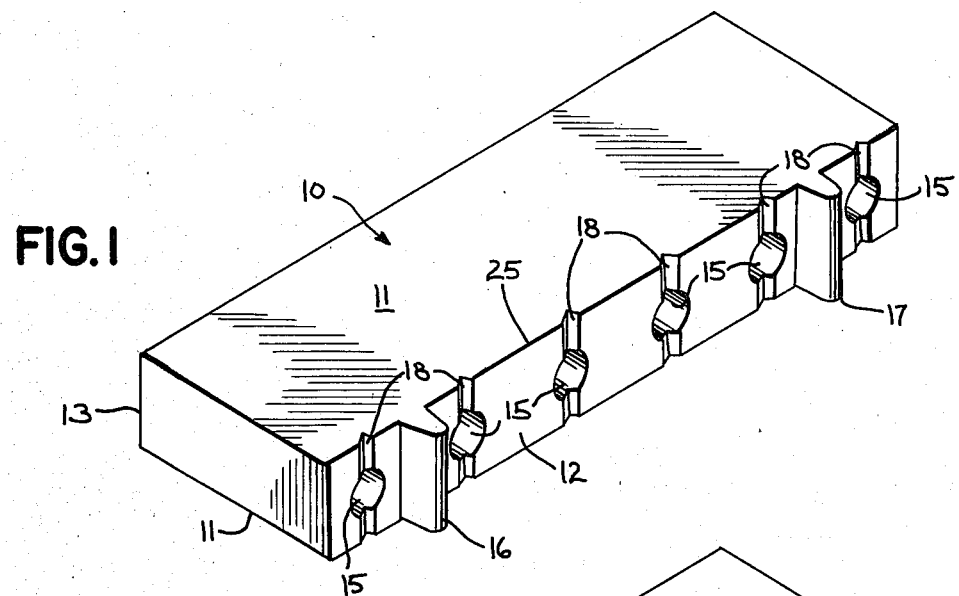
FIG. 1 is a perspective view of a single in-line packaging substrate suitable for use in the practice of the present invention.

An embodiment of the present invention is illustrated in the views of FIGS. 1-4, inclusive. With reference to FIG. 1, it will be observed that a substrate 10 in the form of a parallelepiped is supplied to support electrical circuit components and terminal leads, as will hereinafter be described. The insulating substrate 10 is pressed, or otherwise formed, from a ceramic material, such as alumina or steatite, to provide opposed upper and lower planar surfaces 11. Depending from, and angularly relative to, the planar surface 11 is a side or edge surface 12. This surface 12 is preferably planar and disposed normal to the surfaces 11.

Either one or both of the surfaces 11 may contain the electrical circuitry, which may be in the form of a network of resistors, a combination of resistors and capacitors and semiconductor chips, or chips of capacitors or the like. This circuit configuration is made in accordance with known techniques, and does not form a particular part of the present invention. The single in-line packaged (SIP) device presented by the views of FIGS. 1-4, inclusive, has been previously disclosed and claimed in U.S. Pat. No. 4,127,934, assigned to the same assignee as the present invention.

As was stated in that patent, the side or edge surface 12 includes a plurality of spaced apart openings 15 traversing the substrate 10 from the edge surface 12 all the way through to the opposite edge 13. These openings or apertures 15 are arranged to receive terminal leads, as will hereinafter be described. For the purpose of spacing the edge surface 12 from a circuit board or other supporting means, the substrate 10 is provided with a pair of forwardly projecting standoffs 16 and 17.

Particular attention is drawn to the indentations in the form of grooves 18, which are formed in the edge wall 12, and which also indent inwardly of the planar surface 11. These indentations are an important part of the present invention, and will hereinafter be described in detail. For the present, it is important to note that the grooves may be "V" shaped as shown, or may be rounded off (not shown) in a general "U" shape, or semicircular, where so desired. Although another embodiment will be described, the present embodiment is preferred at this time, since it is more facilely and inexpensively provided under known molding and pressing techniques. Although not specifically shown, it will be apparent that the molding dies are more easily made to form the continuous groove 18 disposed for the entire length of the edge surface 12. The second embodiment illustrated in the views of FIGS. 5 and 6 utilizes indentations in the form of notches, but the notches are necessarily small when compared to the elongated grooves 18. For instance, the presently described substrate has approximate overall dimensions of 0.78"×0.30"×0.08" with grooves 18 being only approximately 0.01" wide at the outermost dimension. Obviously, notches are even smaller and the machining of pressing dies for forming this configuration is very detailed and complex.

Figure 2:
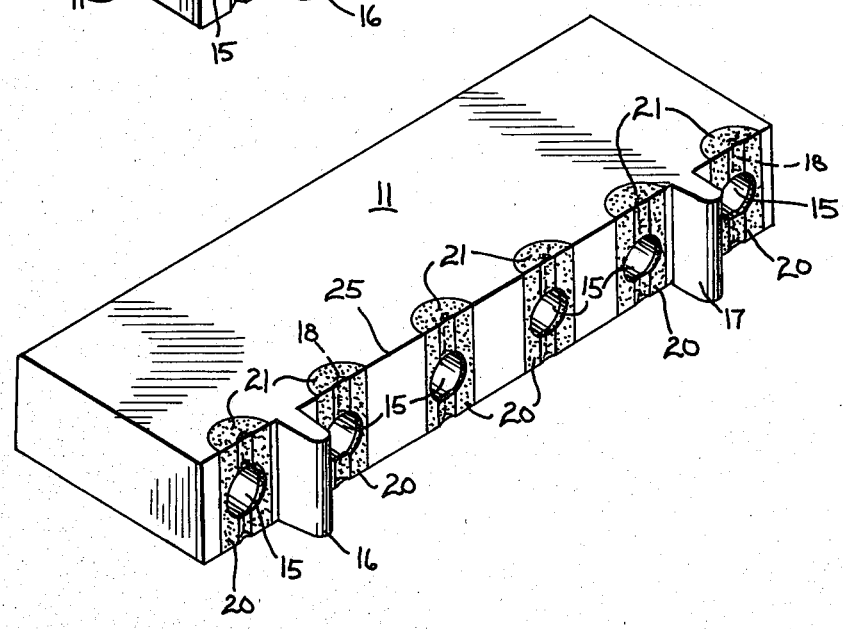
FIG. 2 is a perspective view of the substrate of FIG. 1, illustrating the application of a layer of edge termination material extending from the edge surface and over onto a top surface relative to the view of FIG. 2.

With reference to FIG. 2, the substrate 10 is provided with edge termination areas 20. The areas 20 are transfer printed by means of a transfer wheel (not shown) laying down a conducting material, such as silver paste, which extends across the face of the surface 12, and preferably a bit inwardly of the openings 15. The areas 20 also overlap the surface 11, as shown at 21. This overlapping area 21 connects the electrical circuitry to the edge of the substrate 10, as will later be explained. The material of the termination areas 20 (in this case silver paste) is well-known, and is compatible with solder for connecting to terminal leads. After application, the silver paste edge termination material 20 is fired on the substrate in the usual fashion.

Particular attention is drawn to the fact that the termination material in the areas 20 nearly fills the grooves 18 to serve as a "wire-like" conductor passing from the holes or apertures 15 over and onto the overlapped areas 21 of the surface 11. This arrangement assures adequate thickness of the edge termination material. It is well-known that, although silver paste materials are ideal for serving as conductors and for compatibility with known solders, they also have the disadvantage of tending to migrate into molten solder. The solder, as will later be explained, is deposited in automatic equipment, as fully described in the aforementioned Bartley et al related patents and represented by U.S. Pat. No. 4,127,934, using wave solder baths and other known automatic techniques. As much as the entire process of depositing the edge termination areas 20 and later described soldering techniques is intended to be fully automatic, slight variations in processing can lead to the application of a relatively thin layer at the line of intersection 25. This relatively thin coat will tend to leach away from the substrate and migrate into the later applied solder. The present invention therefore contemplates providing the "wire-like" conductive path to insure proper conductivity between the areas 20 and 21.

Figure 3:
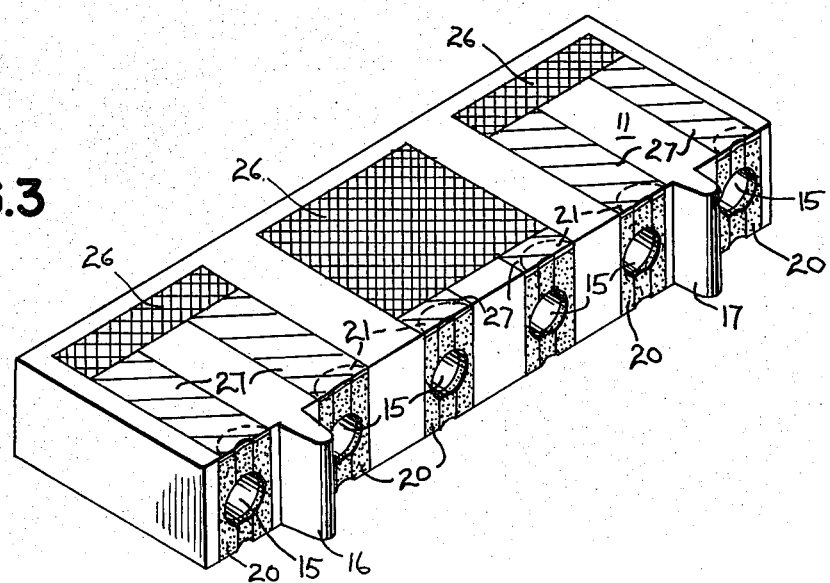
FIG. 3 is a perspective view, including the edge termination material underlying a typical resistive network circuit deposited on the upper surface of the substrate of FIGS. 1 and 2.

With reference to FIG. 3, it will be observed that a typical resistive network may be laid down on the surface 11 with known techniques utilizing thick or thin film material, such as the well-known cermet resistor materials, one of which is described in the Brandt et al U.S. Pat. No. 3,639,274, assigned to the same assignee as the present invention. The particular composition does not form a part of the present invention.

The resistive areas are denoted by the reference character 26, and in the case of cermet material, are screen printed or otherwise deposited to extend over the previously laid down conductive paths 27 which extend into and overlap the edge termination areas 21. Without going into the details of the circuitry, the conductive strips 27 are also of a glassy matrix, including highly conductive metallic materials intermixed therewith. The layers may be fired individually or co-fired as desired. It is generally preferred to provide the conductive paths or layers 27 of material that resist adhesion to solder, to assist in preventing solder from adhering to portions of the substrate where it is unwanted. For this reason, it is also preferable to permit a small portion to slightly overlap the termination material 20 at the upper edge of the planar surface 12.

Figure 4:
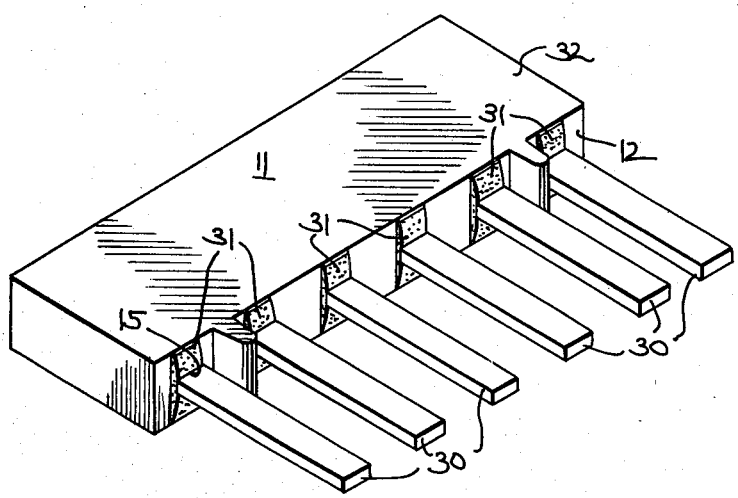
FIG. 4 is a perspective view of the finished product with a conformal coating applied thereto and termination leads mounted and soldered in place to provide a single in-line package.

As illustrated in FIG. 4, leads 30 are inserted in each of the respective openings 15 in the manner disclosed and claimed in U.S. Pat. Nos. 4,127,934, 4,187,529 and 4,213,113. As aforementioned, solder pads 31 are automatically applied by transporting the substrate 11, with the leads 30 attached thereto through a waveform solder bath (not shown). During this assembly process, the leads are preferably attached to a carrier strip of a lead frame (not shown) as disclosed in the aforementioned patents.

It is preferred to provide a conformal coating 32 as a means of protecting the resistive and conductive layers 26 and 27, respectively, from the elements. Identification (not shown) may be printed directly to the conformally coated surface. The solder pads 31 serve to provide additional conductivity from the edge termination material at the areas 20 and overlapping into the areas 21 to connect with the network. The solder pads 31 act to also provide an additional anchoring means for the leads 30.

Figure 5:
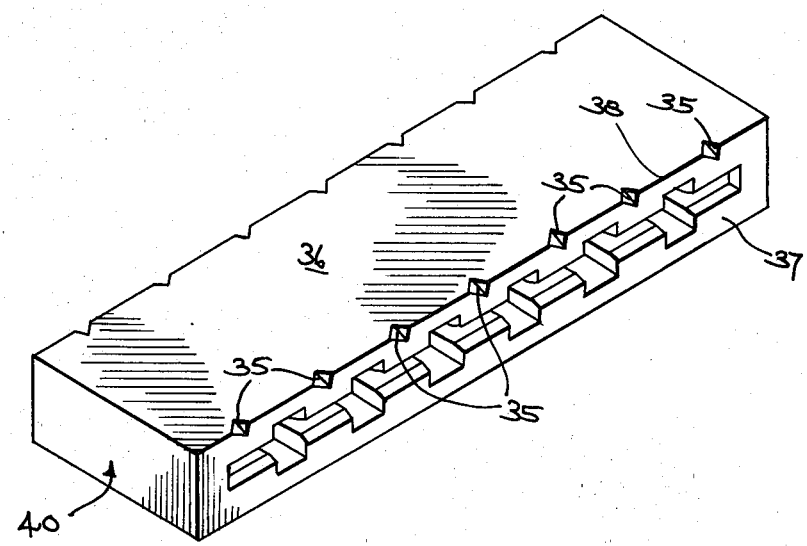
FIG. 5 is a perspective view of a substrate provided for dual in-line packaging, and further arranged to incorporate the teachings of the present invention.
Figure 6:
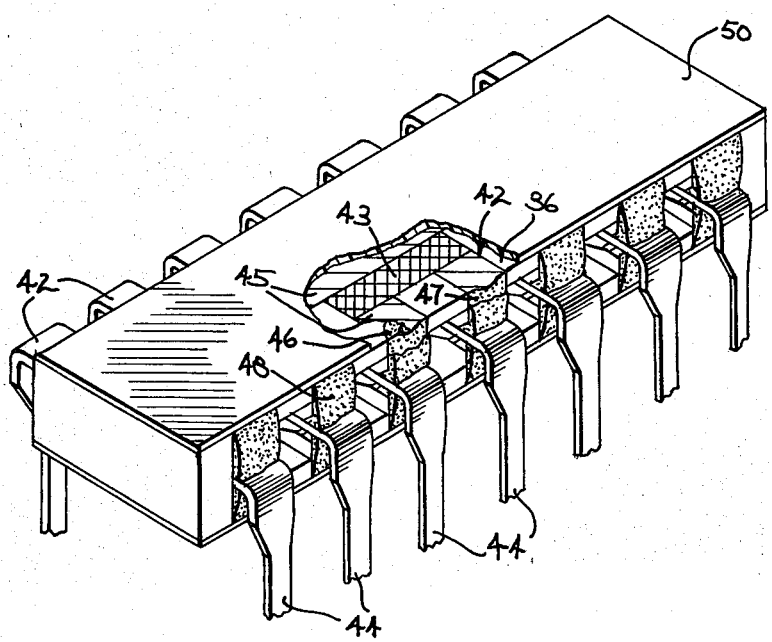
FIG. 6 is a perspective view, partly in section, illustrating a finished dual in-line package device in accordance with a second embodiment of this invention.

The embodiment of FIGS. 5 and 6 illustrate another technique of providing the indented areas, which are the subject of the present invention. It will be apparent that either the grooved indentations illustrated in the views of FIGS. 1-4, or the notches 35 may be utilized in either the SIP or the DIP devices with even facility. The two different devices, i.e. SIP and DIP, are merely shown as examples to indicate broad application of the present invention, which also may reside in various configurations of indented areas traversing between two adjoining planar surfaces, i.e. surfaces at 11 and 12 of the SIP construction of FIGS. 1-4 and planar surfaces 36 and 37 defined by the line of intersection 38 of the substrate 40 of FIGS. 5 and 6. The embodiment of FIGS. 5 and 6 is explained in detail in the Beckman et al U.S. Pat. No. 3,873,890, assigned to the same assignee as the present invention.

Suffice it to state that the dual in-line package construction of the device of FIGS. 5 and 6 comprises a substrate 40 having a surface 36 arranged to receive a thick or thin film network 42 comprising a resistive layer 43 connected to leads 44 by means of conducting paths 45 overlying termination pads 46 which extend from the surface 36 over the line of intersection 38 and onto the edge termination portion 47 of the edge 37. Solder pads 48 are applied as described in connection with the discussion of the first embodiment. A conformal coating 50 is later applied after the leads 44 have been anchored in place.

It will be observed that the notched areas extend between the planar surfaces 37 and 38 to provide a means of increasing the thickness of the edge termination coating overlapping both surfaces 36 and 37 and intersecting the line of intersection 38. This wire-like conductive path assures adequate thickness of termination material to minimize the deleterious effects of "leaching" or migrating of silver into the solder as the solder is applied to retain the leads in place.

Although the invention herein has been specifically described in connection with devices having leads projecting from one or more sides of a substrate, it will also be understood that, such as in the case of certain hybrid circuits (not shown), the provision of the notches 35 or grooves 18 is equally applicable to devices which have no leads. In fact, the invention finds application in instances where solder is not applied. The channels defined by the notches 35 or grooves 18 provide a ready means of assuring adequate "flow" during printing or other deposition of a layer, such as the edge termination areas or portions 21 and 46.

The embodiments of the invention of which an exclusive property or privilege is claimed are defined as follows:

1. In an electrical circuit device including a substrate of electrically insulating material having a first planar surface upon which is disposed an electrical circuit component; an adjoining second generally planar surface angularly disposed relative to said first planar surface; said planar surfaces conjointly defining a line of intersection therebetween; an aperture extending inwardly from said second planar surface and having its entrance opening solely confined to said second planar surface; a terminal lead having a portion thereof seated within said aperture and having its remaining portion extending outwardly from said entrance opening; a conducting edge termination coating deposited transversely of said second planar surface and extending from said aperture over said line of intersection and onto said first planar surface to provide a continuous path between said electrical circuit component and said terminal lead; and a layer of conducting solder deposited on said edge termination coating: the combination therewith of a continuous groove formed in the second planar surface of said substrate, said groove having one end communicating with said aperture and having its opposite end traversing said line of intersection to conjointly communicate with each of said first and second planar surfaces and underlying said deposited edge termination coating; whereby an uninterrupted conducting path of solder and its underlying edge termination coating extends from said lead to connect with said electrical circuit component.

2. The electrical circuit device of claim 1, wherein the said second planar surface is formed to provide a second continuous groove substantially identical with and oppositely disposed from the first mentioned groove and communicating at one end with said aperture, the opposite end of said second groove intersecting a third planar substrate surface parallel with and oppositely disposed relative to said first planar surface and the line of intersection defined by the adjoining second and third planar surfaces.

3. An electrical device as in claim 1, in which the groove has a width not exceeding the width of said aperture.

4. An electrical device as in claim 2, in which each of the respective grooves has a width not exceeding the width of said aperture.

* * * * *